(12) United States Patent
Bhamidipati et al.

(10) Patent No.: US 10,018,672 B2
(45) Date of Patent: *Jul. 10, 2018

(54) REDUCING POWER REQUIREMENTS AND SWITCHING DURING LOGIC BUILT-IN-SELF-TEST AND SCAN TEST

(71) Applicant: INTERNATIONAL BUSINESS MACHINES CORPORATION, Armonk, NY (US)

(72) Inventors: Satya Rama S. Bhamidipati, Andhra Pradesh (IN); Mary P. Kusko, Hopewell Junction, NY (US); Cedric Lichtenau, Stuttgart (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/454,160

(22) Filed: Mar. 9, 2017

(65) Prior Publication Data

US 2017/0176532 A1    Jun. 22, 2017

Related U.S. Application Data

(63) Continuation of application No. 14/941,581, filed on Nov. 14, 2015, now Pat. No. 9,651,616, which is a
(Continued)

(51) Int. Cl.
*G01R 31/317*    (2006.01)
*G01R 31/3177*    (2006.01)

(52) U.S. Cl.
CPC ... *G01R 31/31721* (2013.01); *G01R 31/3177* (2013.01); *G01R 31/31707* (2013.01)

(58) Field of Classification Search
CPC ...... G01R 31/318575; G01R 31/31917; G01R 31/31721; G01R 31/3177; G01R 31/31727; G01R 31/318583
See application file for complete search history.

(56) References Cited

U.S. PATENT DOCUMENTS 6,467,044 B1    10/2002    Lackey
7,647,540 B2    1/2010    Rajski et al.
(Continued)

OTHER PUBLICATIONS

D. Xiang, M. Chen and H. Fujiwara, "Using Weighted Scan Enable Signals to Improve Test Effectiveness of Scan-Based BIST," in IEEE Transactions on Computers, vol. 56, No. 12, pp. 1619-1628, Dec. 2007.*
(Continued)

*Primary Examiner* — Cynthia Britt
(74) *Attorney, Agent, or Firm* — Margaret McNamara; Matthew M. Hulihan; Heslin Rotherberg Farley & Mesiti PC

(57) ABSTRACT

A number of switching transitions of flip-flops during testing is kept below a threshold. Scan-in test data is applied to the flip-flops. Testing result data scanned-out from the flip-flops is captured, and a prediction is made of a number of switching transitions of the flip-flops between a current capture clock cycle and a next capture clock cycle. Furthermore, the testing setup values are modified before the next testing cycle is executed based on the prediction.

10 Claims, 8 Drawing Sheets

Related U.S. Application Data continuation of application No. 14/851,174, filed on Sep. 11, 2015, now Pat. No. 9,651,623.

(56) References Cited

U.S. PATENT DOCUMENTS

| | | | |
|---|---|---|---|
| 7,840,865 B2* | 11/2010 | Lai | G01R 31/318547 714/728 |
| 7,925,465 B2 | 4/2011 | Lin et al. | |
| 8,407,542 B2 | 3/2013 | Douskey et al. | |
| 8,468,404 B1 | 6/2013 | Chickermane et al. | |
| 8,499,209 B2 | 7/2013 | Rajski et al. | |
| 8,615,692 B1* | 12/2013 | Khurana | G01R 31/318575 702/60 |
| 2006/0236182 A1* | 10/2006 | Xiang | G01R 31/31701 714/734 |
| 2007/0250749 A1 | 10/2007 | Lin et al. | |
| 2009/0210759 A1 | 8/2009 | Singhal | |
| 2009/0217117 A1 | 8/2009 | Chmelar | |
| 2014/0365840 A1 | 12/2014 | Lin et al. | |
| 2016/0072483 A1 | 3/2016 | Ikenishi | |

OTHER PUBLICATIONS

Matsushima et al., "CooLBIST—An Effective Approach to Test Power Reduction for LBIST," Nov. 2008, p. 264.

Bakshi, et al., Techniques for Seed Computation and Testability Enhancement for Logic Built-In Selft Test, Aug. 27, 2012, pp. 1-80.

Bhamidipati, Satya Rama S. et al., "Reducing Power Requirements and Switching During Logic Built-In-Self-Test and Scan Test," U.S. Appl. No. 14/851,174, filed Sep. 11, 2015, pp. 1-38.

Bhamidipati, Satya Rama S. et al., "Reducing Power Requirements and Switching During Logic Built-In-Self-Test and Scan Test," U.S. Appl. No. 14/941,581, filed Nov. 14, 2015, pp. 1-34.

Y.Y. Huang, R. Guo, W. T. Cheng and J. C. M. Li, "Survey of Scan Chain Diagnosis," in IEEE Design & Test of Computers, vol. 25, No. 3, pp. 240-248, May-Jun. 2008.

Jiann-Chyi Rau, Po-Han Wu and Ming-Ying Chiang, "A novel gated scan-cell scheme for low Capture Power (LCP) in at-speed testing," Proceedings of the 2009 12th International Symposium on Integrated Circuits, Singapore, 2009, pp. 647-650.

R. T. John, K. D. Sreekanth and S. Sivanantham, "Adaptive Low Power RTPG for BIST based test applications," Information Communication and Embedded Systems (ICICES), 2013 International Conference on, Chennai, 2013, pp. 933-936.

M. H. Yang, Y. Kim, Y. Park, D. Lee and S. Kang, "Deterministic built-in self-test using split linear feedback shift register reseeding for low-power testing," in IET Computers & Digital Techniques, vol. 1, No. 4, pp. 369-376, Jul. 2007.

Office Action in U.S. Appl. No. 14/851,174, dated Sep. 20, 2016, pp. 1-13.

Office Action in U.S. Appl. No. 14/941,581, dated Sep. 22, 2016, pp. 1-11.

Notice of Allowance in U.S. Appl. No. 14/851,174, dated Jan. 12, 2017, pp. 1-5.

Notice of Allowance in U.S. Appl. No. 14/941,581, dated Jan. 12, 2017, pp. 1-9.

List of IBM Patents or Patent Applications Treated As Related, dated Mar. 9, 2017, pp. 1-2.

Bhamidipati, Satya Rama S. et al., "Reducing Power Requirements and Switching During Logic Built-In-Self-Test and Scan Test," U.S. Appl. No. 15/454,113, filed Mar. 9, 2017, pp. 1-35.

* cited by examiner

REDUCING POWER REQUIREMENTS AND SWITCHING DURING LOGIC BUILT-IN-SELF-TEST AND SCAN TEST

This application is a continuation of co-pending U.S. patent application Ser. No. 14/851,174, filed Sep. 11, 2015, entitled "Reducing Power Requirements and Switching During Logic Built-In-Self-Test and Scan Test," which is hereby incorporated herein by reference in its entirety.

BACKGROUND

One or more aspects of the invention relate generally to testing of semiconductor logic chips, and more specifically, to keeping a number of switching transitions of flip-flops during testing below a threshold.

Logic chips have become more and more complex, and the testing of the complex logic has become more and more challenging. Conventionally, logic semiconductor chips have been tested using external automatic test pattern generators (ATPG). However, because of miniaturization and growing complexity it has become more and more challenging to get all signals from an external automatic test pattern generator into the logic circuits on the semiconductor chip, as well as getting all scanned-out data back into the testing system. Thus, logic built-in self-test (LBIST) is an alternative method for testing digital logic on semiconductor chips. Logic built-in self-test is a test method, which allows running the main test loop for chips without any external testers. This test approach typically uses an on-product-block-generator (OPCG) to generate clock sequences for testing, as well as a pseudo random pattern generator (PRPG) and multi-input signal registers (MISR) that are used respectively for pattern generation and response capture. The PRPG generates a test pattern that is supplied into the LBIST scan channels and the response from the scan channels, after the active clock sequence generated by the OPCG, is compressed in MISR(s) which is generally termed as a signature. The LBIST scan channels contain significantly fewer flip-flops than scan chains in a full scan mode. The scanning capture phase generally forms a loop for LBIST which is typically run for many thousands of loops.

During ATPG or LBIST testing, generally more flip-flops will be toggling than in a normal functional mode of the semiconductor chip as the test patterns applied are intended for testing and not for reflecting functional execution. During testing, there are typically about a 50% of 0/1 transitions of flip-flops meaning that there is about 50% switching of flip-flops. On the other side, during functional operation, the generally observed switching rate is much closer to 10% to 30%. This represents a significant gap between both environments—testing mode versus functional mode—resulting in a less accurate testing due to the fact that the higher switching rate generates more noise on the chip internal power lines during testing.

For instance, for a design with an LBIST scan channel length of 1024, each flip-flop in the LBIST channel has 1024 scan clocks and data shifted 1024 times on each transition. The total number of transitions per channel during the scan phase depends on the current channel content and scanned-in data. Also, during the active clock sequence, as the flip-flop content is more random than during functional usage, more flip-flops will also see a transition and/or "illegal" states will be tested. This larger number of flip-flop toggling leads to a large change in the consumed current per time period and noise across the test circuit that does not represent the real functional usage of the circuit. This results in additional unnecessary guard bending of the circuit that translates directly into an increased voltage/lower frequency sort to overcome the noise resulting in e.g., down-binning to a lower performance sort and/or could result in unnecessary yield loss.

SUMMARY

In accordance with one aspect, a method of keeping a number of switching transitions of flip-flops of a semiconductor chip during testing below a threshold value is provided. The method includes applying scan-in test data to flip-flops of a semiconductor chip. The method also includes capturing testing result data scanned-out from said flip-flops. The method further includes predicting a number of switching transitions of said flip-flops between a current capture clock cycle and a next capture clock cycle. The method also includes modifying one or more testing setup values before a next testing cycle is executed based on said predicting.

Additional features and advantages are realized through the techniques described herein. Other embodiments and aspects are described in detail herein and are considered a part of the claimed aspects.

BRIEF DESCRIPTION OF THE DRAWINGS

The aspects defined above and further aspects of the present invention are apparent from the examples of embodiments to be described hereinafter and are explained with reference to the examples of embodiments, but to which aspects of the invention are not limited.

Embodiments of the invention will be described, by way of example only, and with reference to the following drawings.

DETAILED DESCRIPTION

Figure 1:
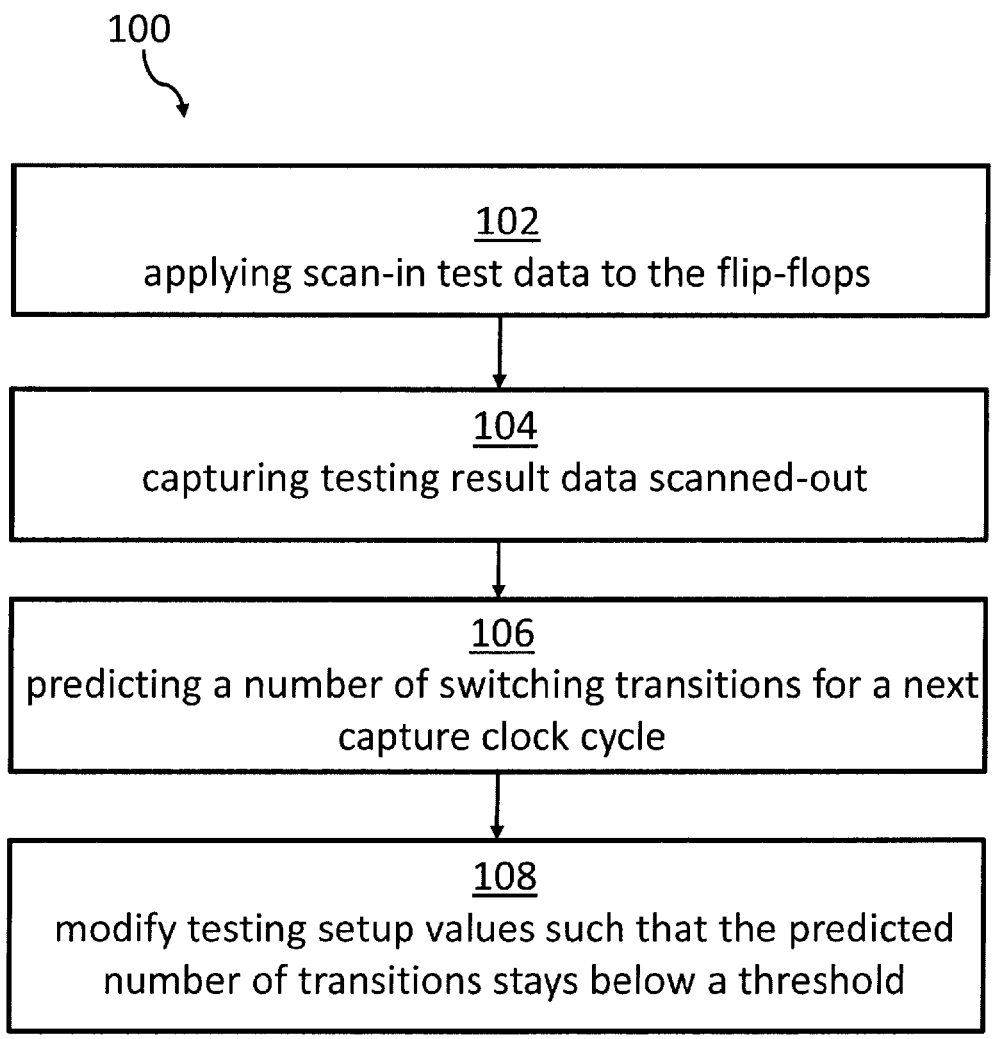
FIG. 1 shows one example of a block diagram of an embodiment of a method for keeping a number of switching transitions of flip-flops during testing below a threshold.

In the context of this description, the following conventions, terms and/or expressions may be used:

The term 'switching transition' may denote a change from one state to the other state of a flip-flop which may be stable in two alternative statuses.

The term 'semiconductor chip' may denote a device comprising a plurality of logic functions implemented using different passive and active electronic devices integrated into one solid state integrated circuit. In some cases—in particular in the LBIST case—also testing equipment in the form of special test circuits are implemented on the semiconductor chip. In case of a usage of an ATPG, a front-end test circuit may be part of the semiconductor chip or DUT (device under test).

The term 'testing' may denote a functional test of all functions the semiconductor device may provide. For this, test patterns may be applied to the device under test (DUT) and measurements may be made investigating the generated outcomes of applying the test patterns resulting in testing results scanned-out.

The term 'scan-in test data' may denote those test patterns that may be applied to the semiconductor device under test comprising the plurality of semiconductor functions. The scan-in test data may be applied using scan channels.

The term 'testing result data scanned-out' may denote measured results after the scan-in test data have been applied to the semiconductor device and the capture clock schema was applied. The testing result data scanned-out may represent the provoked outcome of the applied test patterns.

The term 'capture clock cycle' may denote a clock cycle that may be applied to the semiconductor device after the scan-in test data have been applied to the DUT. In functional mode, the semiconductor device operates under normal clock cycles with typically several 100 MHz or GHz. During testing, typically only one cycle is applied to the DUT and then the result of the scan-in test data or test patterns applied is measured or captured after one clock cycle. Different capture clock schema may be applied. A capture clock schema may relate to different timing conditions the capture clock may apply to the DUT or a different number of clock cycles.

The term 'testing setup value' may denote a set of parameters having different values that may influence the testing. The testing setup values may comprise a seed value for a pseudo random pattern generator, weighing factors and capture clock schemas that may be altered upfront to a test cycle or during testing.

The term 'automatic test pattern generator' or ATPG may denote a device, as well as a method, for testing semiconductor chips. An ATPG may typically be implemented outside the DUT. Needles may provide contacts to the DUT. Also measurement values—in particular, testing result data scanned-out—may be captured after an applied clock cycle to the DUT. An alternative used for semiconductor chip testing are logic built-in self-test systems which are co-implemented on and/or in the semiconductor chip and execute program instructions—in particular microcode—to perform the testing, e.g., during manufacturing.

The term 'toggling' may denote a switching between two alternative statuses of, e.g., a flip-flop.

One or more aspects of a method for keeping a number of switching transitions of flip-flops during testing below a threshold, in accordance with one or more aspects, may offer the following:

It is possible to reduce the number of 0/1 transitions of flip-flops during testing of a semiconductor which may be much closer to the number of transitions of flip-flops in a functional mode of a semiconductor logic chip. This may reduce the noise on the lines of the logic chip—in particular on the power lines—because of a reduced average change and consume power. Because chips may not be sorted out due to a testing failure which may actually be caused by the unnaturally high electronic noise within the chip during testing, the test yield may increase representing a clear technical and economic advantage.

Because the scanned-in signals for testing the logic of the chip may be altered automatically applying different methods—new seed values for the pseudorandom pattern generator, new weights for a weighing of test patterns, changed capture clock sequence schema, or new scan in values for the non-built in test methods—there is a high flexibility in adopting test patterns for the automatic testing which is much closer to a behavior of the logic in a functional mode without impacting significantly the test time as other approaches that control only the scan-in data are delivering. Additionally, one or more aspects may be applied to LBIST as well as ATPG. Thus, both alternative testing methods may be supported by the newly proposed testing method and testing circuit.

Moreover, because the test pattern yields less switching it becomes possible to test or scan, respectively at a higher rate which in turn saves tester time if an external (ATPG) tester is used.

One or more aspects reflect a current state of a device under test (DUT) during the capture clock schema and predicts/determines the number of transitions flip-flops have to undergo for a next test pattern. If the number of transitions is expected to be too high compared to a predefined threshold number of transitions, the applied scanned-in data—i.e., the test pattern—will be adapted before being applied as a test pattern for a subsequent capture clock cycle. One or more aspects make it possible that one or more parameters may be adapted in order to keep the number of transitions of flip-flops from one capture clock cycle to the next below the predefined threshold: the seed value for the PRPG, weighing factors for the scanned-in data as well as the applied capture clock schema.

In the following, a detailed description of the figures will be given. All instructions in the figures are schematic. Firstly, a block diagram of an embodiment of a method for keeping a number of switching transitions of flip-flops during testing below a threshold, in accordance with an aspect of the present invention, is given. Afterwards, further embodiments as well as embodiments of a test circuit for keeping a number of switching transitions of flip-flops during testing below a threshold will be described.

FIG. 1 shows one example of a block diagram of an embodiment of a method 100 for keeping a number of switching transitions of flip-flops during testing—in particular manufacturing testing—below a threshold. The method may comprise applying, 102, scan-in test data to the flip-flops; and capturing, 104, testing result data scanned-out from the flip-flops. The method also comprises predicting or determining, 106, a number of switching transitions of the flip-flops for a next capture clock cycle—in particular, during a current capture clock cycle. For the prediction, the scan-in test data for the next capture clock cycle and the testing result data scanned-out of the current capture clock cycle are used.

Additionally, the method 100 may comprise modifying, 108, testing setup values such that the predicted or determined number of switching transitions of the flip-flops stays below the threshold. This is performed before the next testing cycle is executed and is based on the prediction/determination in order to enter a new configuration of a testing circuit. The testing circuit may be triggerable internally, e.g., using LBIST and a PRPG, or it may be triggerable externally, i.e., using ATPG techniques with an external tester.

According to one embodiment of the method 100, at least two capture clock schemas for the testing circuit may be supported. They may in alternative embodiments be generated internally—using LBIST—or, in another alternative embodiment be received from an external source—using an ATPG, as mentioned already above. Thus, both testing methods may be supported. In the LBIST case, the testing circuit and the logic built-in tester may be one joint integrated circuit; e.g., the test patterns generating circuit may be implemented as a pseudo-random pattern generator as a component on the chip. In the case the ATPG technique is used, the testing circuit may be an on-chip, front-end circuit to the ATPG.

According to another embodiment of the method 100, applying weight factors to the seed value for generating test patterns before applying the test patterns may be comprised as part of the method. The seed value for test patterns—in particular, a seed value for a PRPG—to be applied to parallel test channels may be used to influence the effect test patterns may have on different parallel test channels. If, e.g., a weight factor may be reduced from "1" to "0" the specific component of the test pattern, e.g., the specific bit of the test pattern the weight factor is applied to, may not be reflected during such a test cycle.

According to one embodiment of the method 100, the weighing factors are comprised in the testing setup values. Thus, the modifying the testing setup values comprises automatically a modification option for the weighing factors, and thus, an influence of the generated test patterns to the scan channels before they are applied as scan-in test data.

According to one embodiment of the method 100, the modifying of the seed value comprises a left shift or a right shift of the seed value by one digital position. This may also be interpreted as a multiplication by 2 or a division by 2. However, with a different seed value, the PRPG may generate a different test pattern which may require fewer changes from one applied scan-in test pattern to a next one, which may in turn reduce the required transitions of involved flip-flops.

According to one embodiment of the method 100, the modifying the weight factors may comprise increasing or decreasing the weight factor. This may be implemented by a left or right shift or by adding 1 or subtracting 1 from the respective weight factor. Different implementation alternatives may be known to a skilled person.

According to one embodiment of the method 100, the modifying of the testing setup values may also comprise toggling the one of the at least two capture clock schemes to its alternative capture clock schema. However, more than two capture clock schemas may be available as part of the testing circuit. In such a case, the method may comprise influencing the capture clock schema in a way that different capture clock schemas may be used in order to modify the configuration of the testing circuit, and thus, the testing conditions.

All mentioned additional features of the method may also be applicable to the related test circuit for keeping a number of switching transitions of flip-flops during testing below a threshold.

Figure 2:
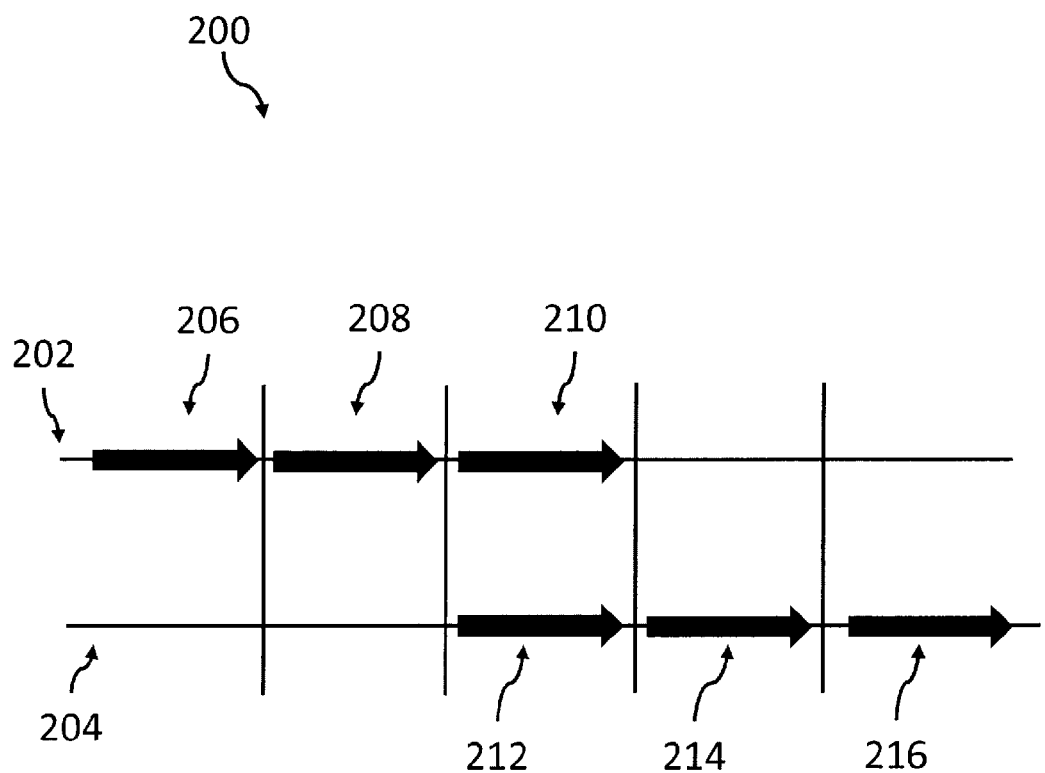
FIG. 2 shows one example of a block diagram illustrating the timing for scan-in test data and capturing test data scanned-out.

FIG. 2 shows one example of a block diagram 200 illustrating the timing for test data scanned-out and capturing test data. Line 202 illustrates a test loop m−1 with a scan load step 206, meaning that testing data may be scanned-in into the flip-flops (via the test channels); a capture sequence step 208, meaning that resulting scanned-out data are captured; and a scan unload step 210. In parallel to this last scan unload step 210, a next scan load step 212 from test loop m 204 is performed. It should be noted that this scan load step 212 is performed in parallel to the scan unload step 210 from test loop m−1. However, it does not need to be executed in parallel. Subsequently, a capture sequence step 214 and a scan unload step 216 of test loop m 204 may be performed.

Figure 3A:
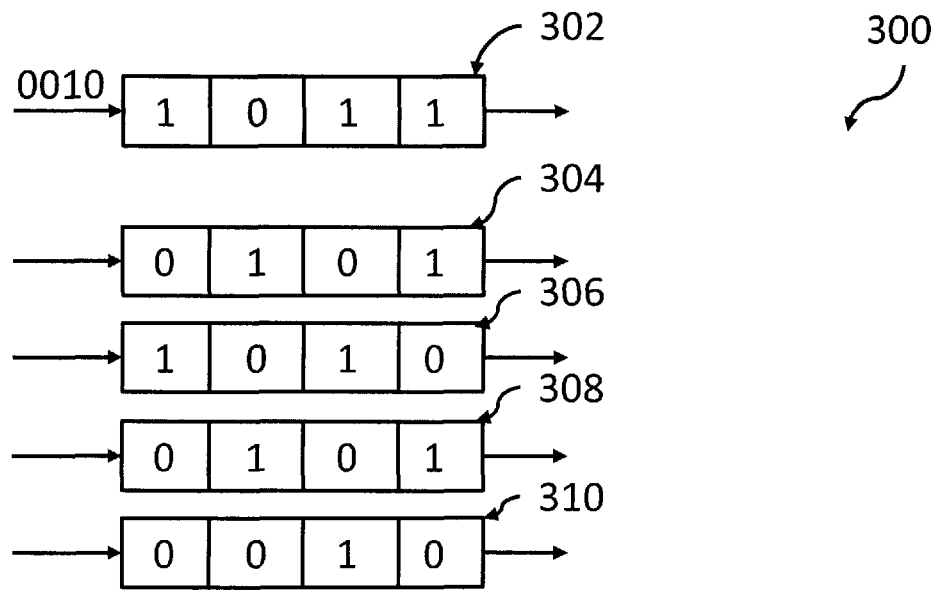
FIGS. 3A-3B show examples of block diagrams illustrating 0/1 transitions for flip-flops from one testing cycle to a next.

FIG. 3A shows one example of a block diagram 300 illustrating 0/1 transitions for flip-flops from one testing cycle to a next. It may be assumed that the test pattern 302 "1011" may currently describe a status of involved flip-flops after a testing cycle or a test loop m. It may also be assumed that a new test pattern "0010" should be applied to the same flip-flops. A series of transitions between "0" and "1" or "1" and "0" have to be performed in order to arrive at the test pattern setting "0010", as shown in 310 reflecting the scan channel's function. In a first transition from the setting shown in 302 to the bit pattern, shown in 304, three flip-flop transitions have to be performed. In the subsequent transitions from 304 to 306 and from 306 to 308 and from 308 to 310, four and four and three 0/1 or 1/0 transitions are required, respectively. Thus, in total 14=3+4+4+3 transitions have to be performed in order to apply the test pattern "0010" to a testing cycle m+1 when starting with a scanned-out capture testing result "1011", as shown in 302.

Figure 3B:
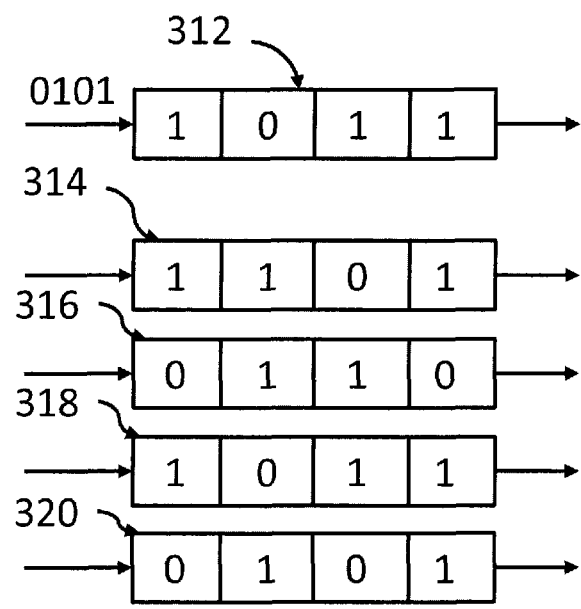

In an alternative example, as shown in FIG. 3B, the same starting scanned-out capture testing result with the test pattern "1011" in 312 may be assumed. It may now be assumed that the new test pattern "0101" should be applied to the corresponding flip-flops. In this case, only 11 transitions are required to arrive at the scan-in test pattern "0101" in 320. The number of 11 transitions is the result of: two transitions from 312 to 314, three transitions from 314 to 316, three transitions from 316 to 318, and three transitions from 318 to 320; thus, 11=2+3+3+3. As a consequence, 11 transitions represent about 27% less transitions from one status of the flip-flops to another one if compared to the earlier example.

Hence, if the configuration of the captured test pattern scanned-out after the capture clock cycle in the new test pattern to be scanned-in is known, the number of transitions within scan channels, i.e., respective flip-flops, is predictable or determinable. However, it may also be taken into account that the number of direct flip-flop transitions from status 302 to status 310 is two (from 1011 to 0010), while the number of direct flip-flop transitions from status 312 to 320 is three (1011 to 0101). Hence, the number of direct transitions is not a good measure for the number of required transitions if scan channels are involved. Therefore, a prediction of the number of involved transitions via scan channels is employed in reducing the number of required transitions, whereby different test patterns to be scanned-in are to be taken into account.

Figure 4:
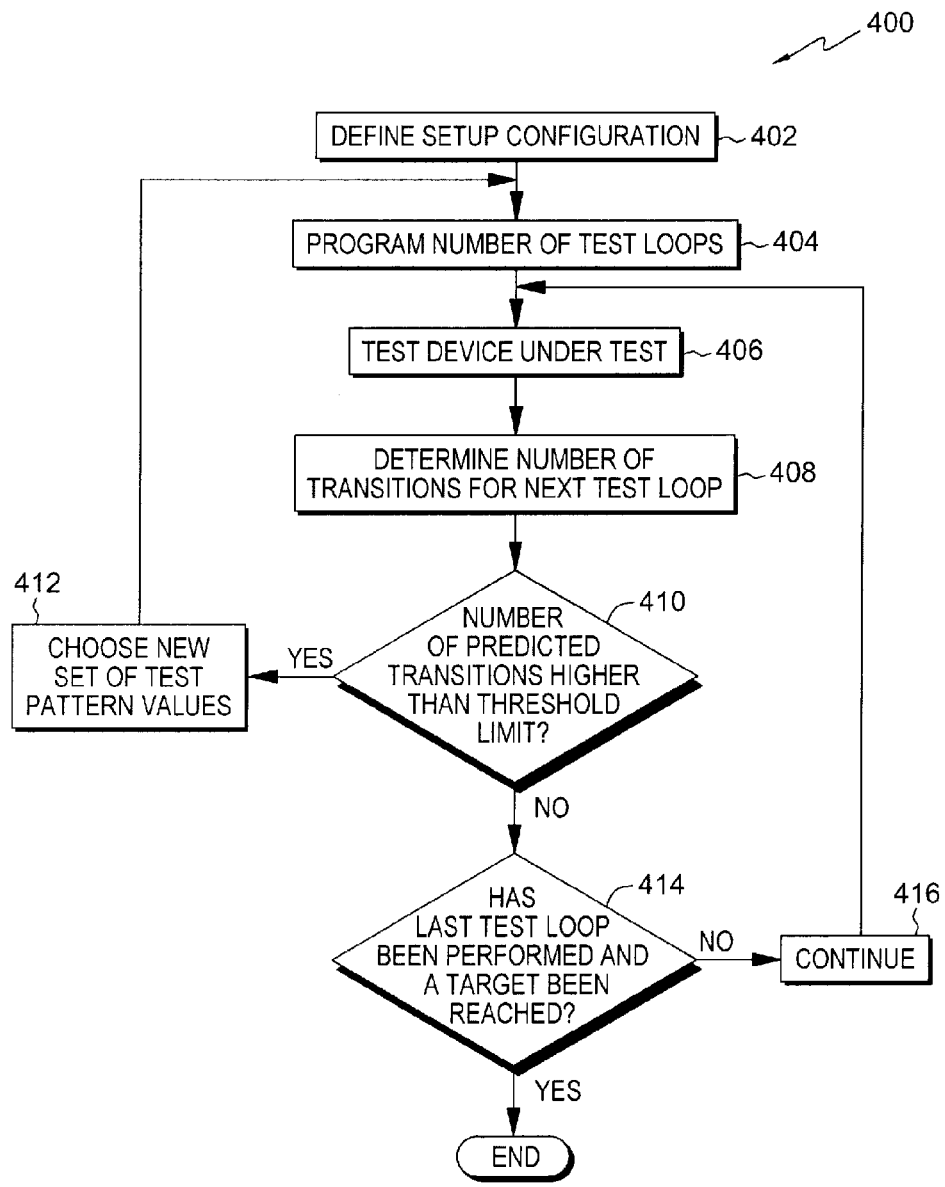
FIG. 4 shows one example of a block diagram of a general flow of steps according to an embodiment of the present invention.

FIG. 4 shows one example of a block diagram of a general flow 400 of steps according to an embodiment of the present invention. In step 402, a setup configuration is defined. This may comprise a threshold limit for the number of transitions allowed from one testing cycle to the next testing cycle, the seed value for a pseudo random pattern generator (PRPG), a weighing value and a selected clock sequence. In a next step 404, the number of test loops to be performed is programmed. Then, in step 406, the testing of the device under test is performed for one test loop m which may comprise a scanned channel fill, i.e. apply test pattern scan-in, and apply a capture clock sequence to compute/simulate/predict the expected test capture data. Again, in a next step 408, also the number of transitions for the next test loop m+1 based on capture data from a previous testing cycle and the known new test pattern to be scanned-in for the next loop is determined.

In step 410, it may be determined whether the number of predicted flip-flop transitions is higher than the threshold limit for the number of transitions allowed. In case of "yes"—compare block 412—a new set of test pattern values, e.g., weight, PRPG seed, capture clock sequence—may be chosen, in order to reenter the sequence of actions at step 404. Then a prediction is made on a different set of test pattern values. However, at this stage no additional testing cycle m+1 may be performed.

In case of "no" in step 410, it may be determined, 414, whether the last test loop has been performed and a testing coverage target has been reached. In case of "no", the testing cycles will be the continued, 416, with a current PRPG value, a weighing and a capture clock sequence with step 406.

More specific embodiments with basically the same flowchart 400 of steps will now be described. In one embodiment, a weight value is altered; in another embodiment the testing clock schema is altered; and in a third alternative embodiment, the test clock sequence is altered. All three work basically the same way as described in FIG. 4. Differences are as follows:

In case of an altered seed value for the PRPG, in block 402 a setup configuration is defined with an initial random PRPG seed value. Also, a threshold limit for the number of transitions may be defined and allowed from one testing cycle to the next testing cycle. In step 404, the number of test loops may be programmed as well as a selection of the capture clock sequence, and a fixed weight factor may be defined. The action in block 406 would be performed as in the general case of FIG. 4. The same applies to block 408 and determination block 410.

However, in block 412, in case of "yes" regarding the determination whether the predicted number of transitions of flip-flops is higher than a threshold number, the seed value for the PRPG is shifted left or right by one position if viewed in a binary format. This is equivalent to modifying the setup configuration of the testing, i.e., modifying the testing setup values. The actions in the remaining blocks of the flowchart would stay unchanged.

In the case of an altered weighing, in block 402, a setup configuration is defined with an initial random PRPG seed value and an initial weighing. Step 404 would then comprise a programming of the number of test loops to be performed. Apart from block 412, all other actions in the other function blocks of the flow chart would stay unchanged. However, in block 412, the weighing factor would be changed by one, in particular from 1 to 0 or from 0 to 1. That would mean that a weighing from 8:1 would either be changed to 16:1 or the 4:1. The flow would then go back to block 404 until a weighing factor is found that satisfies the condition that the number of transitions of flip-flops stays below the defined threshold if the testing enters the next testing cycle.

The last alternative cares about changing the capture clock sequence. In this case, in step 402, an initial clock sequence may be defined as part of the testing setup values. The seed value for the PRPG and the weighing factor would also be set, but would stay fixed in this alternative. Again, in step 404, the number of test loops would be programmed. The remaining steps and blocks would stay unchanged apart from block 412.

Here, the capture clock sequence would be changed either by adding or by reducing the number of clock pulses in a sequence of 1. After that modification to the testing setup values, the process flow would continue to step 404 again in order to satisfy the condition that the number of transitions of flip-flops stays below the defined threshold if the testing enters the next testing cycle.

Thus, these three alternative embodiments are derivable from the general flow described in the context of FIG. 4.

Figure 5:
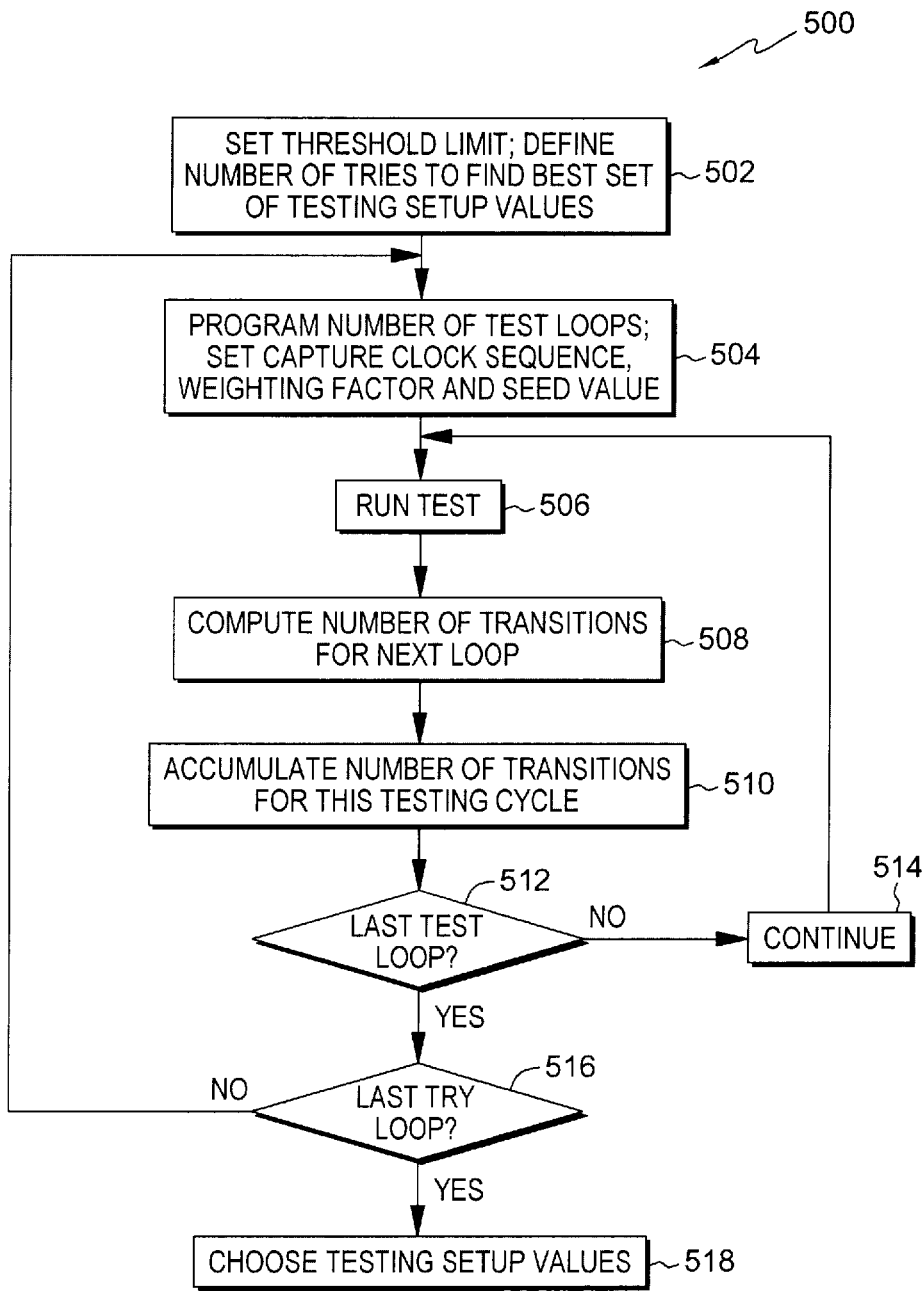
FIG. 5 shows one example of an enhanced embodiment of the method, in accordance with an aspect of the present invention.

FIG. 5 shows one example of an enhanced embodiment 500 of one or more aspects. In block 502, a threshold limit for the number of transitions allowed is set as usual. Additionally, a number of tries, A, to find the best set of testing setup values is defined. In step 504, the number of test loops is programmed and the capture clock sequence is set together with a weighing factor and a seed value for the PRPG, as explained above. Then, in block 506 the testing is run for one loop (channel fill and capture clock sequence) to compute/simulate/predict the expected test capture data. In step 508, the number of transitions for the next loop based on captured test data scanned-in from the previous step and to be scanned-in data for the next loop is computed. Then, in step 510 the number of transitions for this testing cycle with this test pattern may be accumulated and it may be tested in step 512 whether the current one is the last test loop. In case of "no", the process flow continues, 514, with proceeding with the current PRPG seed, weighing factor and capture locking sequence and the process flow goes back to step 506.

In case of "yes" in the determination step 512, it would be determined whether the current loop is the last try loop, step 516. In case of "no" the process flow will go back to step 504. In case of "yes" the process flow will continue to step 518 and will choose the testing setup values from the try loop with the smallest number of accumulated transitions. This may represent a further enhancement and optimization of the already proposed selection of testing setup values.

Figure 6:
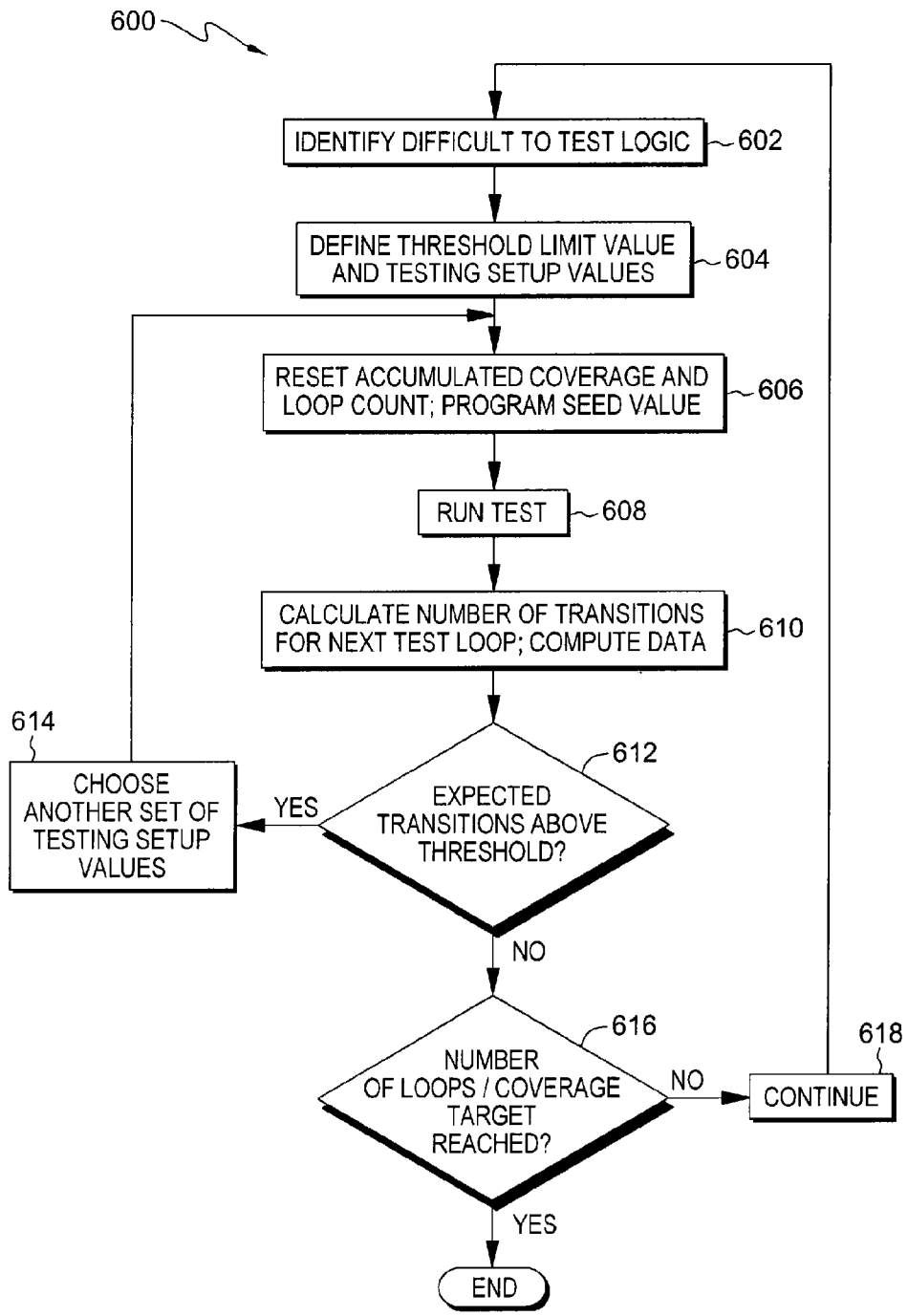
FIG. 6 shows one example of a flowchart of a further enhanced embodiment of the present invention.

A further alternative embodiment of a proposed method 100 will now be described with reference to the flowchart 600 of FIG. 6. Initially, in step 602, a difficult to test logic may be identified from which a target set of faults may be expected. For this, a collective set of care for these faults may be determined. For the set of care bits, a seed value for their PRPG may be determined.

In a next step 604, the threshold limit value for the number of transitions allowed, as well as a capture locking sequence and a weighing factor may be defined as testing setup values. Then, in step 606, the accumulated coverage and the loop count are reset, and the calculated PRPG seed value is programmed. Then again, in step 608 the testing is run for one loop (channel fill and capture clock sequence) to compute/simulate/predict/determine the testing capture data.

In step 610, as usual, the number of transitions for the next test loop may be calculated based on the captured testing result data from the previous step, and the to be tested result scanned-in data for the next loop may be computed. In step 612, it may be determined whether the number of expected transitions is above the predefined threshold number. In case of "yes", another set of testing setup values is chosen in step 614 by reducing the number of care bits and a recalculation of a PRPG seed value. Then, the process flow goes back to step 606 to again reset the accumulated coverage and loop count, and program the calculated PRPG value.

If in the determination step 612 the result is "no", a next determination 616 may be performed to determine whether the number of loops/coverage target has been reached. In case of "no", in step 616, the process flow loops back to step 602 by proceeding with the capture clock sequence and a determination of a new seed value for the PRPG, compare block 618.

Figure 7:
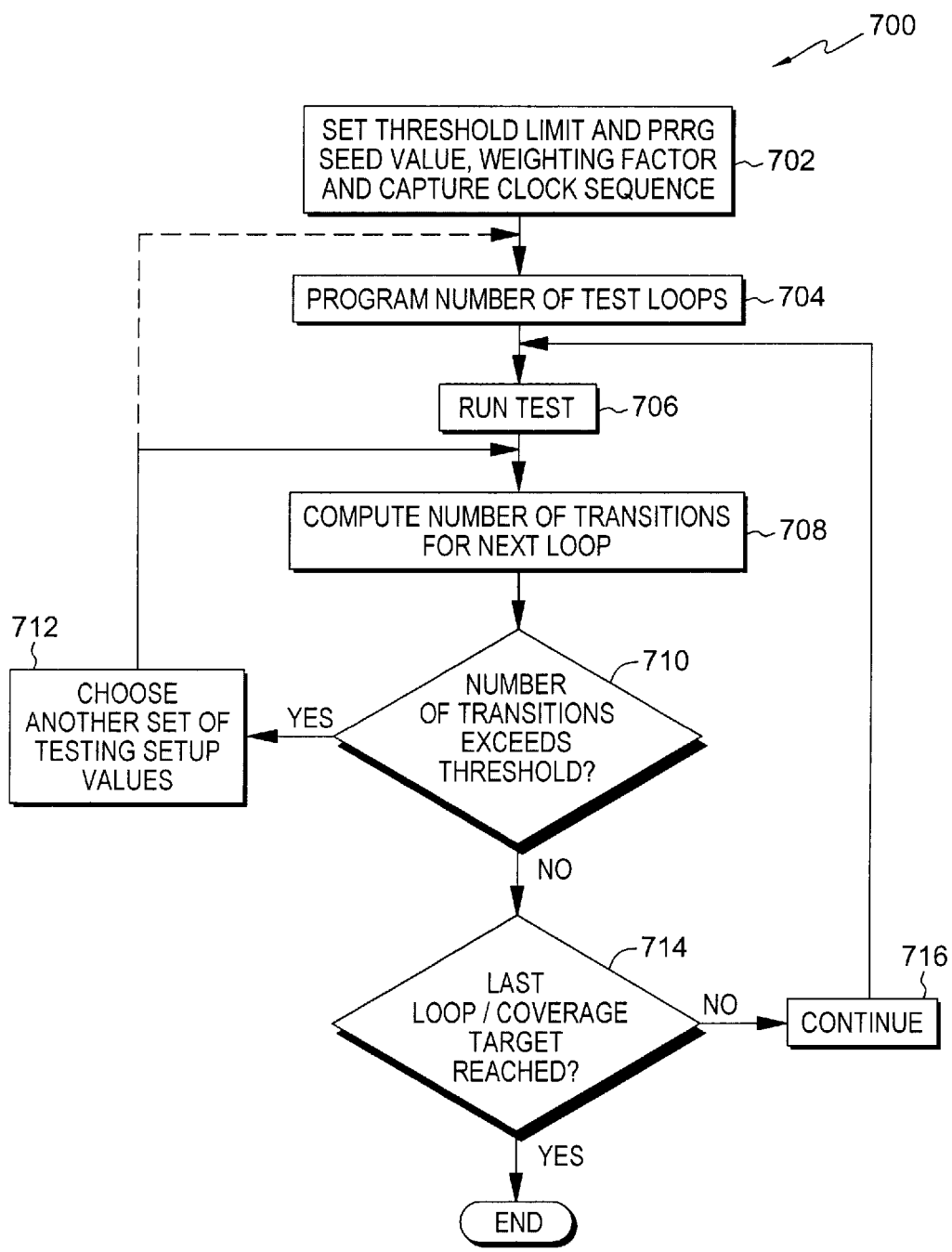
FIG. 7 illustrates one example of an alternative embodiment with an alternative general flow if compared to FIG. 4.

FIG. 7 illustrates one example of an alternative embodiment with an alternative general flow 700. This flow diagram illustrates one or more aspects, wherein "good" seed values are investigated. Instead of restarting a complete test loop, this embodiment looks for a next low-transitions test loop set up. This may especially be applied to "good" ATPG pattern determination dependent on current flip-flop content and new scanned-in data from a previous testing cycle.

In step 702, the threshold limit for a number of transitions allowed is set as well as the PRPG seed value, weighing factor, and capture clock sequence. In step 704, the number of test loops is programmed. In a next step 706, the testing is run for one loop (channel fill and capture clock sequence) to compute/simulate/predict/determine the expected capture data scanned-in. As in all previous examples, in step 708 the number of transitions for the next loop is computed based on captured test data scanned-in from the previous step and the to be scanned-in data for the next loop.

In determination step 710 it is determined whether the number of transitions exceeds the related threshold value. In case of "yes", in step 712, another set of testing setup values is chosen, e.g. weight factor value, PRPG value and/or capture clocking sequence. The process flow may then go back to either step 708 or alternatively to step 704.

In the case the determination step 710 determines a "no", a next determination step 714 may be performed to determine if the last loop/coverage target is reached. In case of "no", the testing process would proceed with the current PRPG value, weighing factor and capture clock sequence in step 716 and return back to step 706. In case of "yes", in determination step 714, this testing approach ends.

Figure 8:
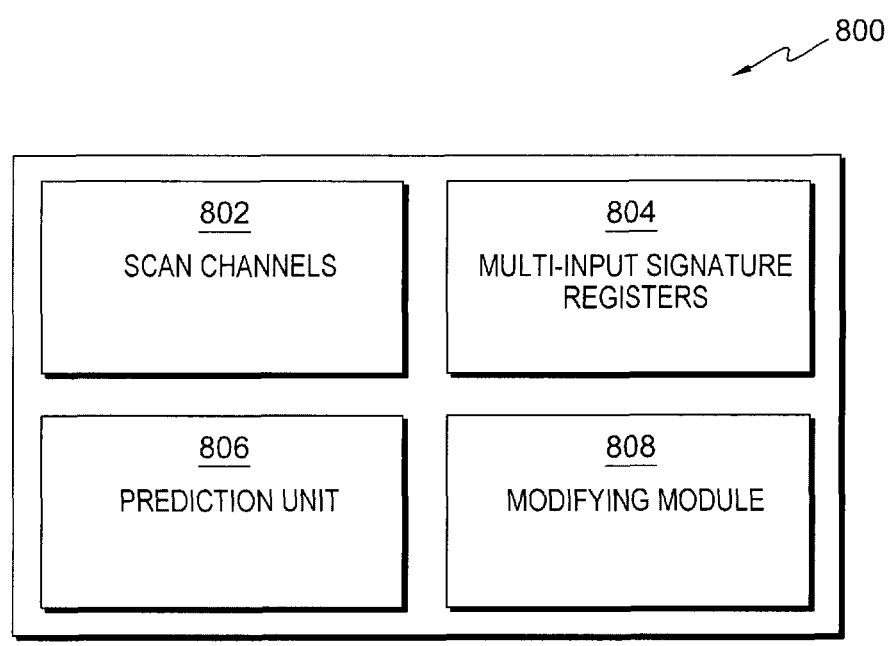
FIG. 8 shows one example of a block diagram of testing circuit, in accordance with an aspect of the present invention.

FIG. 8 shows one example of an overview block diagram of a testing circuit 800, in accordance with one or more aspects of the present invention, for keeping a number of switching transitions of flip-flops of a semiconductor chip during testing below a threshold value in which the semiconductor chip comprises logic circuits. The testing circuit comprises a plurality of scan channels 802 for applying scan-in test data to the flip-flops and a plurality of multi-input signature registers 804 adapted for capturing testing result data scanned-out from the flip-flops.

The testing circuit 800 comprises as well a prediction unit 806 adapted for predicting a number of switching transitions of the flip-flops during a current capture clock cycle for a next capture clock cycle. Thereby, the scan-in test data for the next capture clock cycle and the testing result data scanned-out of the current capture clock cycle are used as a basis.

Additionally, the testing circuit comprises a modifying module 808 adapted for a modification of testing setup values before the next testing cycle is executed based on the prediction in order to enter a new configuration of a testing circuit such that the predicted number of switching transitions of the flip-flops stays below the threshold. It may be noted that the testing setup values comprise parameters for a modification of the capture clock cycle and a seed value for generating test patterns.

As described herein, according to one aspect of the present invention, a method for keeping a number of switching transitions of flip-flops during testing below a threshold may be provided. The method may comprise applying scan-in test data to the flip-flops, capturing testing result data scanned-out from the flip-flops, and predicting a number of switching transitions of the flip-flops between a current capture clock cycle and a next capture clock cycle—in particular for the next capture clock cycle—thereby using the scan-in test data for the next capture clock cycle and the testing result data scanned-out of the current capture clock cycle. Additionally, the method may comprise modifying testing setup values before the next testing cycle is executed based on the prediction in order to enter a new configuration of a testing circuit such that the predicted number of switching transitions of the flip-flops stays below the threshold. The testing setup values may comprise—but may not be limited to—parameters for modifying the capture clock cycle schema and a seed value for generating test patterns.

According to another aspect of the present invention, a testing circuit for keeping a number of switching transitions of flip-flops during testing below a threshold may be provided. A testing circuit may comprise a plurality of scan channels for applying scan-in test data to the flip-flops, a plurality of multi input signature registers adapted for capturing testing result data scanned-out from the flip-flops, and a prediction unit adapted for predicting a number of switching transitions of the flip-flops between a current capture clock cycle for a next capture clock cycle—in particular for the next capture clock cycle—thereby using the scan-in test data for the next capture clock cycle and the testing result data scanned-out of the current capture clock cycle.

Furthermore, the testing circuit may comprise a modifying module adapted for a modification of testing setup values before the next testing cycle is executed based on the prediction in order to enter a new configuration of the testing circuit such that the predicted number of switching transitions of the flip-flops stays below the threshold. The testing setup values may comprise—but may not be limited to—parameters for a modification of the capture clock cycle schema and a seed value for generating test patterns.

Additionally, according to another aspect of the present invention, a related semiconductor may be provided which comprises the above-mentioned testing circuit for keeping a number of switching transitions of flip-flops during testing below a threshold.

Furthermore, embodiments may take the form of a related computer program product, accessible from a computer-usable or computer-readable medium providing program code for use, by or in connection with a computer or any instruction execution system, e.g., an ATPG or in microcode for a LBIST. For the purpose of this description, a computer-usable or computer-readable medium may be any apparatus that may contain means for storing, communicating, propagating or transporting the program for use, by or in a connection with the instruction execution system, apparatus, or device.

It should be noted that embodiments of the invention are described with reference to different subject-matters. In particular, some embodiments are described with reference to method type claims whereas other embodiments have been described with reference to apparatus type claims. However, a person skilled in the art will gather from herein that, unless otherwise notified, in addition to any combination of features belonging to one type of subject-matter, any combination between features relating to different subject-matters, e.g., between features of the method type claims, and features of the apparatus type claims, is considered as to be disclosed within this document.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention may be embodied as a system, a method, and/or a computer program product. The computer program product may include a computer readable storage medium (or media) having computer readable program instructions thereon for causing a processor to carry out aspects of the present invention, in particular, a controller driven by a microcode in case of an LBIST or OPMISR (on-product multi-input signal registers). Alternatively, at least parts of the method may be executed using the ATPG.

The medium may be an electronic, magnetic, optical, electromagnetic, infrared or a semi-conductor system for a propagation medium. Examples of a computer-readable medium may include a semi-conductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), DVD and Blu-Ray-Disk.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of aspects of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or another devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or another device to cause a series of operational steps to be performed on the computer, other programmable apparatus or other device to produce a computer implemented process, such that the instructions which execute on the computer, other programmable apparatus, or another device implement the functions/acts specified in the flowchart and/or block diagram block or blocks.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to limit aspects of the invention. As used herein, the singular forms "a", "an" and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of aspects of the present invention has been presented for purposes of illustration and description, but is not intended to be exhaustive or limited to aspects of the invention in the form disclosed. Many modifications and variations will be apparent to those of ordinary skills in the art without departing from the scope and spirit of aspects of the invention. The embodiments are chosen and described in order to best explain the principles of aspects of the invention and the practical application, and to enable others of ordinary skills in the art to understand aspects of the invention for various embodiments with various modifications, as are suited to the particular use contemplated.

What is claimed is:

1. A method comprising:
    applying scan-in test data to flip-flops of a semiconductor chip;
    capturing testing result data scanned-out from said flip-flops;
    predicting a number of switching transitions of said flip-flops between a current capture clock cycle and a next capture clock cycle; and
    modifying one or more testing setup values before a next testing cycle is executed based on said predicting.

2. The method of claim 1, wherein the predicting uses said scan-in test data for said next capture clock cycle and said testing result data scanned-out of said current capture clock cycle.

3. The method of claim 1, wherein the modifying enters a new configuration of the testing circuit, wherein the number of switching transitions of said flip-flops predicted stays below a threshold value.

4. The method of claim 1, wherein the one or more testing set up values comprises at least two capture clock cycle schemas for said testing circuit.

5. The method of claim 4, wherein said modifying of said one or more testing setup values comprises toggling one of said at least two capture clock cycle schemas to its alternative capture clock cycle schema.

6. The method of claim 1, further comprising receiving test patterns from a logic built-in self-test circuit or from an external automatic test pattern generator.

7. The method of claim 1, wherein said one or more testing setup values comprises one or more parameters for modifying a capture clock schema and a seed value for generating test patterns.

8. The method of claim 7, further comprising applying one or more weight factors to said seed value for generating test patterns before applying said test patterns.

9. The method of claim 8, wherein said one or more testing setup values further comprises said one or more weight factors, and wherein said modifying said testing setup values comprises modifying said one or more weight factors.

10. The method of claim 9, wherein said modifying said one or more weight factors comprises increasing or decreasing said one or more weight factors.

\* \* \* \* \*